(12) United States Patent
Kudo et al.

(10) Patent No.: US 7,706,074 B2
(45) Date of Patent: Apr. 27, 2010

(54) PROJECTION OPTICAL SYSTEM, METHOD OF MANUFACTURING PROJECTION OPTICAL SYSTEM, EXPOSURE APPARATUS, AND EXPOSURE METHOD

(75) Inventors: Yuji Kudo, Tokyo (JP); Takeshi Iwasaki, Fujisawa (JP)

(73) Assignee: Nikon Corporation, Tokyo (JP)

( * ) Notice: Subject to any disclaimer, the term of this patent is extended or adjusted under 35 U.S.C. 154(b) by 491 days.

(21) Appl. No.: 11/662,066

(22) PCT Filed: Sep. 8, 2005

(86) PCT No.: PCT/JP2005/016496

§ 371 (c)(1),
(2), (4) Date: Mar. 7, 2007

(87) PCT Pub. No.: WO2006/030684

PCT Pub. Date: Mar. 23, 2006

(65) Prior Publication Data

US 2008/0123086 A1    May 29, 2008

(30) Foreign Application Priority Data

Sep. 13, 2004    (JP)  ............................. 2004-265674

(51) Int. Cl.
G02B 1/00    (2006.01)
(52) U.S. Cl. ........................................ 359/649; 355/18
(58) Field of Classification Search ......... 359/649–651; 355/18–77

See application file for complete search history.

(56) References Cited

U.S. PATENT DOCUMENTS 5,473,410 A    12/1995    Nishi (Continued)

FOREIGN PATENT DOCUMENTS

CN    1374560 A    10/2002

(Continued)

OTHER PUBLICATIONS

"Guidebook for Manufacturing and Testing Device of Very Large-Scale IC", Kogyo Chosakai Publishing, Inc., Nov. 27, 2003.

(Continued)

Primary Examiner—Darryl J Collins
(74) Attorney, Agent, or Firm—Oliff & Berridge, PLC (57) ABSTRACT

A projection optical system provided with at least one of optical members made of a calcium fluoride single crystal,
  wherein each of the optical members satisfies at least any one of the following conditions of (i) to (iii):
  (i) an RMS value of a spatial frequency component having a number of periods $f_{PD}$ in partial diameter in a range from 10 periods to 50 periods inclusive out of fluctuation of a transmission wavefront relative to light having a wavelength of 633 nm is equal to or below 0.35 nm/cm;
  (ii) an RMS value of a spatial frequency component having a number of periods $f_{PD}$ in partial diameter in a range from 10 periods to 100 periods inclusive out of fluctuation of a transmission wavefront relative to light having a wavelength of 633 nm is equal to or below 0.45 nm/cm; and
  (iii) an RMS value of a spatial frequency component having a number of periods $f_{PD}$ in partial diameter in a range from 10 periods to 150 periods inclusive out of fluctuation of a transmission wavefront relative to light having a wavelength of 633 nm is equal to or below 0.50 nm/cm.

13 Claims, 6 Drawing Sheets

U.S. PATENT DOCUMENTS

| | | |
|---|---|---|
| 5,825,043 A | 10/1998 | Suwa |
| 5,969,441 A | 10/1999 | Loopstra et al. |
| 6,208,407 B1 | 3/2001 | Loopstra |
| 6,341,007 B1 | 1/2002 | Nishi et al. |
| 6,400,441 B1 | 6/2002 | Nishi et al. |
| 6,424,471 B1 * | 7/2002 | Ulrich et al. ................ 359/732 |
| 6,549,269 B1 | 4/2003 | Nishi et al. |
| 6,590,634 B1 | 7/2003 | Nishi et al. |
| 6,665,126 B2 * | 12/2003 | Shafer et al. ................ 359/649 |
| 6,782,074 B2 | 8/2004 | Sakuma |
| 6,788,389 B2 | 9/2004 | Fujishima et al. |
| 6,862,078 B2 | 3/2005 | Suzuki |
| 6,961,186 B2 * | 11/2005 | Pierrat et al. ................ 359/649 |
| 2002/0154281 A1 * | 10/2002 | Finders ........................ 355/52 |
| 2003/0053036 A1 | 3/2003 | Fujishima et al. |
| 2003/0218729 A1 | 11/2003 | Suzuki et al. |
| 2004/0004757 A1 | 1/2004 | Schuster |

FOREIGN PATENT DOCUMENTS

| | | |
|---|---|---|
| EP | 1 413 870 A1 | 4/2004 |
| JP | A 6-124873 | 5/1994 |
| JP | A 8-005505 | 1/1996 |
| JP | A 8-005801 | 1/1996 |
| JP | A 10-163099 | 6/1998 |
| JP | A 10-214783 | 8/1998 |
| JP | A 10-303114 | 11/1998 |
| JP | A 2000-121491 | 4/2000 |
| JP | A 2000-505958 | 5/2000 |
| JP | A 2001-258131 | 9/2001 |
| JP | A 2003-161708 | 6/2003 |
| WO | WO 03/004987 A1 | 1/2003 |
| WO | WO 03/007045 A1 | 1/2003 |

OTHER PUBLICATIONS

Nov. 17, 2009 Search Report for EP 05 77 8604.

* cited by examiner

PROJECTION OPTICAL SYSTEM, METHOD OF MANUFACTURING PROJECTION OPTICAL SYSTEM, EXPOSURE APPARATUS, AND EXPOSURE METHOD

TECHNICAL FIELD

The present invention relates to a projection optical system, a method of manufacturing a projection optical system, an exposure apparatus, and an exposure method. Specifically, the present invention relates to a projection optical system including an optical member used in a specific wavelength range equal to or below 250 nm, a method of manufacturing the projection optical system, an exposure apparatus, and an exposure method, which are applied to an ultraviolet lithography technique.

BACKGROUND ART

A photolithographic exposure apparatus for manufacturing a semiconductor element such as an LSI, a liquid crystal display element, a thin film magnetic head or the like is configured to perform exposure by irradiating light from a light source onto a pattern on a projection original plate such as a mask or a reticle through an illumination optical system, and by projecting the pattern onto a photosensitive substrate such as a wafer or a glass plate coated with a photoresist in advance through a projection optical system. The types of the projection optical system include a dioptric projection optical system including lenses for transmitting and refracting light having an exposure wavelength, a catoptic projection optical system including a mirror for reflecting the light having the exposure wavelength, and a catadioptric projection optical system combining the lenses and the mirror.

In recent years, the integration degree of semiconductor elements and the like is increasing and patterns to be transferred onto substrates are continuously getting smaller. Accordingly, a photolithographic exposure apparatus has been changing its light source from the i-line (365 nm), the KrF excimer laser (248 nm), the ArF excimer laser (193 nm), and further to the $F_2$ laser (157 nm) to progress the shortening of wavelengths. In this concern, there is a growing demand for the photolithographic exposure apparatus in the optical system to achieve a higher optical performance. In particular, there is a demand for the projection optical system, which is configured to transfer a fine mask pattern onto a photosensitive surface of a wafer, to achieve extremely high optical performance at high resolution and with very little aberration. To meet this demand, there is a growing demand for an extremely high level of refractive index homogeneity in optical members including lenses, prisms, mirrors, photomasks, and the like (hereinafter, optical members for photolithography) used as an optical system of a photolithographic exposure apparatus.

Conventionally, evaluation of refractive index homogeneity of an optical material for photolithography has been conducted by measuring a wavefront aberration generated when light passes through the optical material and defining a difference between a maximum value and a minimum value of the wavefront aberration (hereinafter referred to as a PV value) or a root mean square value (hereinafter referred to as an RMS value) as an evaluation index. To be more precise, it has been considered that a more excellent optical material had a smaller PV value or RMS value. That is, an optical material to be categorized in high quality has been manufactured by way of reducing these values.

For example, Japanese Unexamined Patent Application Publication No. Hei 8-5505 (JP 8-5505 A) discloses the following evaluation method of the refractive index homogeneity. Concrete procedures of this method are described below.

(Procedure 1) An optical material for photolithography polished into a column or a prism shape is set on an interferometer, and a reference wavefront is emitted perpendicularly to a polished surface to measure the wavefront aberration. Information attributable to refractive index distribution of the optical material appears on the measured wavefront aberration. Of the measured wavefront aberration, an error aberration attributable to a curvature component is called either as a power component or a focus component, while an error aberration attributable to a gradient component is called as a tilt component.

(Procedure 2) The power component and the tilt component are removed from the measured wavefront aberration.

(Procedure 3) Moreover, a wavefront aberration attributable to an astigmatism component is removed.

(Procedure 4) The remaining wavefront aberration is split into a rotationally symmetric component and a non-rotationally symmetric component (a random component).

(Procedure 5) The PV value and the RMS value of the non-rotationally symmetric component (the random component) are obtained, and evaluation is carried out based on these values.

(Procedure 6) The rotationally symmetric component is fitted to an aspheric formula with the least square method to remove quadratic and biquadratic components. The PV values and the RMS values for remaining sextic and higher even-ordered wavefront aberration components (hereinafter referred to as a quadratic-biquadratic residual error) are found. Then, evaluation is carried out based on these values.

As it is apparent from the above-described procedures, an optical material having the small non-rotationally symmetric component (the random component) and the small quadratic-biquadratic residual error, has been deemed as an excellent optical material in the refractive index homogeneity, and efforts have been made to manufacture such an optical material.

Upon construction of an optical system, multiple pieces of optical members manufactured by use of the optical materials evaluated as described above are combined together. Concerning evaluation of an imaging performance of the optical system thus constructed, Japanese Unexamined Patent Application Publication No. 2000-121491 proposes a fitting method applying a Zernike's cylinder function system. In this method, evaluation is carried out by measuring the wavefront aberration while allowing the light to pass through the optical system, fitting (expanding) those data to the Zernike's cylinder function system, and classifying them into respective components of a rotationally symmetric component, an odd-number rotational component, and an even-number rotational component. The respective components of the rotationally symmetric component, the odd-number rotational component, and the even-number rotational component have strong correlations with a spherical aberration, a coma aberration, and astigmatism, respectively. Accordingly, it is possible to carry out the evaluation of the optical system directly in association with the imaging performance.

Meanwhile, International Publication No. 03/004987 (WO 2003-004987 A) discloses a method of evaluating inhomogeneity of refractive indices of individual optical members constituting an optical system by utilizing Zernike expansion of wavefront aberrations.

DISCLOSURE OF THE INVENTION

However, even in the case of applying the above-described conventional methods of evaluating an optical member, flare light of the optical member becomes a major problem in a projection optical system of an exposure apparatus. Accordingly, the present invention proposes a new evaluation index reflecting an influence to short-range flare on optical members for photolithography. Thus, the present invention aims at providing a projection optical system with a reduced amount of short-range flare, a manufacturing method thereof, an exposure apparatus, and an exposure method using the exposure apparatus.

The inventors of the present invention have focused on the point that the above-mentioned flare light is caused by a wavefront aberration of an optical member constituting a projection optical system. They have found out that an aspect of an influence to an exposure surface varies in response to a spatial frequency component of a wavefront aberration (fluctuation of a transmission wavefront), and that the spatial frequency components in a range from 10 periods to several hundreds of periods in terms of the number of periods in partial diameter cause the short-range flare (or local flare).

Figure 1:
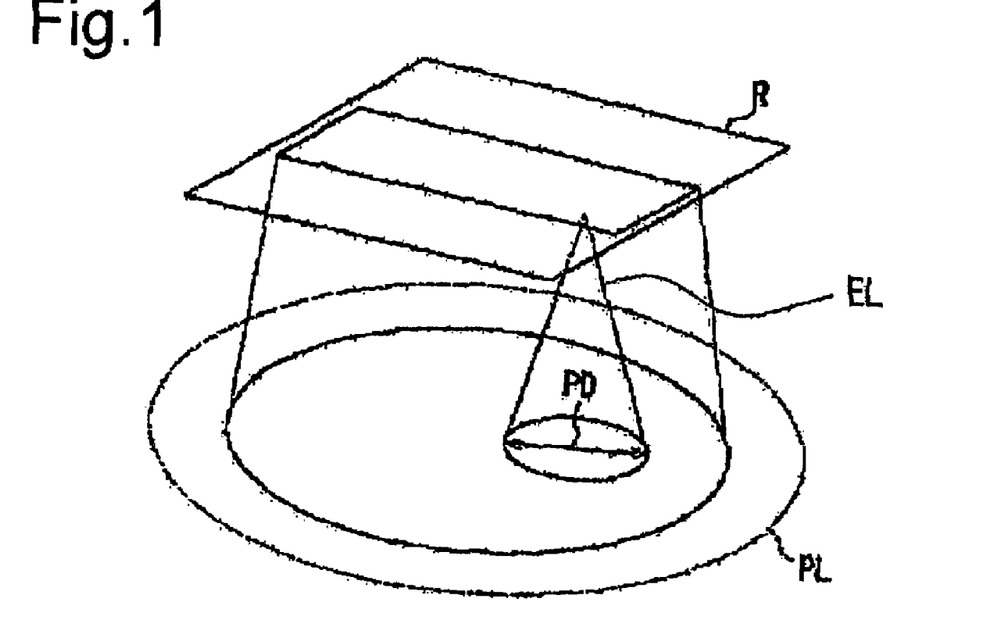
FIG. 1 is a view for explaining a concept of a partial diameter.

Here, the "number of periods $f_{PD}$ in partial diameter" means the number of periods obtained by cutting out a cyclic function of a spatial frequency $f$ (mm$^{-1}$) by a partial diameter PD (mm), i.e. f×PD. Meanwhile, the "partial diameter PD" means a diameter or a minor axis of an irradiated region when luminous flux EL emitted from one point on a first surface R having a predetermined numerical aperture irradiates on an optical member PL (FIG. 1).

Accordingly, the inventors of the present invention focus on the spatial frequency component of the fluctuation of the transmission wavefront mainly caused by refractive index inhomogeneity regarding an optical member made of calcium fluoride among the optical members constituting the optical system. The present invention provides a projection optical system, a method of manufacturing the projection optical system, an exposure apparatus, and an exposure method described below while setting an RMS value of a component corresponding to the predetermined number of periods in partial diameter of the optical member equal to or below the predetermined value.

<1> A projection optical system provided with at least one of optical members made of a calcium fluoride single crystal, wherein each of the optical members satisfies at least any one of the following conditions of (i) to (iii):

(i) an RMS value of a spatial frequency component having a number of periods $f_{PD}$ in partial diameter in a range from 10 periods to 50 periods inclusive out of fluctuation of a transmission wavefront relative to light having a wavelength of 633 nm is equal to or below 0.35 nm/cm;

(ii) an RMS value of a spatial frequency component having a number of periods $f_{PD}$ in partial diameter in a range from 10 periods to 100 periods inclusive out of fluctuation of a transmission wavefront relative to light having a wavelength of 633 nm is equal to or below 0.45 nm/cm; and (iii) an RMS value of a spatial frequency component having a number of periods $f_{PD}$ in partial diameter in a range from 10 periods to 150 periods inclusive out of fluctuation of a transmission wavefront relative to light having a wavelength of 633 nm is equal to or below 0.50 nm/cm.

<2> The projection optical system according to <1>, in which each of the optical members satisfies a condition that the RMS value of the spatial frequency component having the number of periods $f_{PD}$ in partial diameter in the range from 10 periods to 50 periods inclusive out of fluctuation of the transmission wavefront relative to the light having the wavelength of 633 nm is equal to or below 0.35 nm/cm.

<3> The projection optical system according to <1>, in which each of the optical members satisfies a condition that the RMS value of the spatial frequency component having the number of periods $f_{PD}$ in partial diameter in the range from 10 periods to 100 periods inclusive out of the fluctuation of the transmission wavefront relative to the light having the wavelength of 633 nm is equal to or below 0.45 nm/cm.

<4> The projection optical system according to <1>, in which each of the optical members satisfies a condition that the RMS value of the spatial frequency component having the number of periods $f_{PD}$ in partial diameter in the range from 10 periods to 150 periods inclusive out of the fluctuation of the transmission wavefront relative to the light having the wavelength of 633 nm is equal to or below 0.50 nm/cm.

<5> The projection optical system according to any of <1> to <4>, in which each of the optical members satisfies a condition that an Average Radial PSD value of the spatial frequency component having the number of periods $f_{PD}$ in partial diameter in the ranges described above out of the fluctuation of the transmission wavefront relative to the light having the wavelength of 633 nm is equal to or below 0.01 nm$^2$/period$^2$.

<6> A method of manufacturing a projection optical system including the steps of: measuring transmission wavefronts of calcium fluoride single crystals and finding two-dimensional distribution of wavefront aberrations, Fourier transforming the two-dimensional distribution and calculating two-dimensional power spectra of fluctuations of the transmission wavefronts, calculating an Average Radial PSD value for each spatial frequency in the two-dimensional power spectra, calculating an RMS value by integrating the Average Radial PSD values in a predetermined spatial frequency range, selecting the calcium fluoride single crystal having the RMS value equal to or below a predetermined upper limit, manufacturing an optical member by processing the selected calcium fluoride single crystal, and manufacturing a projection optical system including the optical member made of the calcium fluoride single crystal.

<7> The method of manufacturing a projection optical system according to <6>, in which the spatial frequency range satisfies the number of periods $f_{PD}$ in partial diameter in a range from 10 periods to 50 periods inclusive, and the upper limit of the RMS value is equal to 0.35 nm/cm.

<8> The method of manufacturing a projection optical system according to <6>, in which the spatial frequency range satisfies the number of periods $f_{PD}$ in partial diameter in a range from 10 periods to 100 periods inclusive, and the upper limit of the RMS value is equal to 0.45 nm/cm.

<9> The method of manufacturing a projection optical system according to <6>, in which the spatial frequency range satisfies the number of periods $f_{PD}$ in partial diameter in a range from 10 periods to 150 periods inclusive, and the upper limit of the RMS value is equal to 0.50 nm/cm.

<10> The method of manufacturing a projection optical system according to <6>, further including the step of selecting the calcium fluoride single crystal satisfying the Average Radial PSD value equal to or below a predetermined upper limit in the predetermined spatial frequency range.

<11> The method of manufacturing a projection optical system according to <10>, in which the upper limit of the Average Radial PSD value is equal to 0.01 nm$^2$/period$^2$.

<12> An exposure apparatus including the projection optical system according to any of <1> to <5>.

<13> An exposure method using the exposure apparatus according to <12>.

The above-described projection optical system of the present invention is configured to set a specific spatial frequency component equal to or below a predetermined value, the specific spatial frequency component being one which has an influence to short-range flare in spatial frequency components of fluctuation of a transmission wavefront in an optical member made of a calcium fluoride single crystal. Accordingly, it is possible to provide a projection optical system capable of reducing short-range flare on an exposure surface and obtaining high resolution.

DETAILED DESCRIPTION OF THE PREFERRED EMBODIMENTS

Now, the present invention will be described below in detail in accordance with preferred embodiments.

Projection Optical System and Manufacturing Method Thereof

First Embodiment

A projection optical system configured to reduce short-range flare and a manufacturing method thereof of the present invention will be described to begin with.

First of all, a method of evaluating fluctuation of a transmission wavefront of a calcium fluoride single crystal in the present invention and a projection optical system of the present invention will be described. Fluctuation of a transmission wavefront is measured with a Fizeau interferometer for measurement of planar optical members, using a He—Ne laser with a wavelength of 633 nm as a light source. This interferometer has a structure which is capable of fixing a measuring object interposed between two parallel flat plate members. Note that, it is more direct to use the KrF excimer laser or the ArF excimer laser as the light source for this interferometer. However, the He—Ne laser is frequently used as the light source for reasons such as manufacturing and maintenance costs of the interferometer, footprints or stability.

Figure 2A:
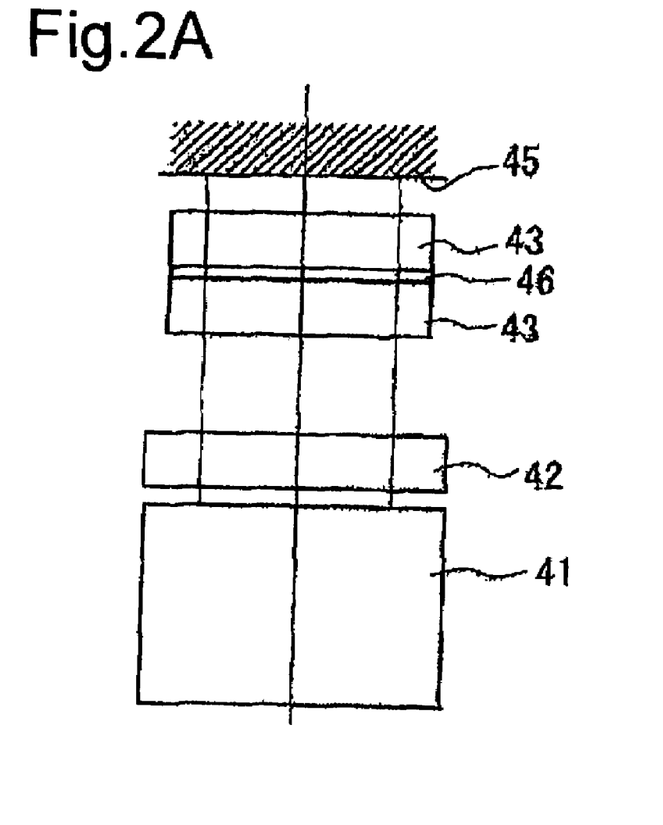
FIG. 2A is a view showing a configuration example of a Fizeau interferometer.
Figure 2B:
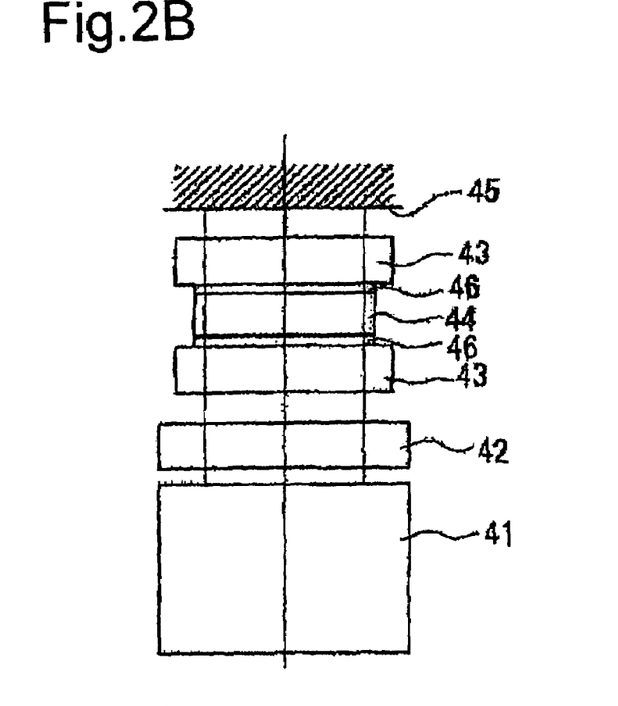
FIG. 2B is another view showing the configuration example of the Fizeau interferometer.

Measurement of the transmission wavefront can be performed in accordance with an oil-on-plate method. FIG. 2A and FIG. 2B are schematic drawings showing states of an interferometer preferably used for the measurement. An interferometer preferably used for the measurement includes a body portion 41, a reference surface object 42, two parallel flat plate members 43, and a reflecting surface 45.

Upon the measurement of the transmission wavefront, firstly, prior to setting a calcium fluoride single crystal 44 as a sample on this interferometer, transparent oil 46 having the same refractive index as that of the measuring object is filled in a gap between the two parallel flat plate members 43. Then, a reference wavefront formed with a laser beam is irradiated in this state. Consequently, 2.5-dimensional wavefront data are obtained by imaging the transmitted light. This state is shown in FIG. 2A.

Next, while setting the calcium fluoride single crystal 44 between the two parallel flat plate members 43, the transparent oil 46 is filled in a gap between the parallel flat plate member 43 and the calcium fluoride single crystal 44. In this state, the 2.5-dimensional wavefront data are obtained by imaging the transmitted light. This state is shown in FIG. 2B.

Figure 3:
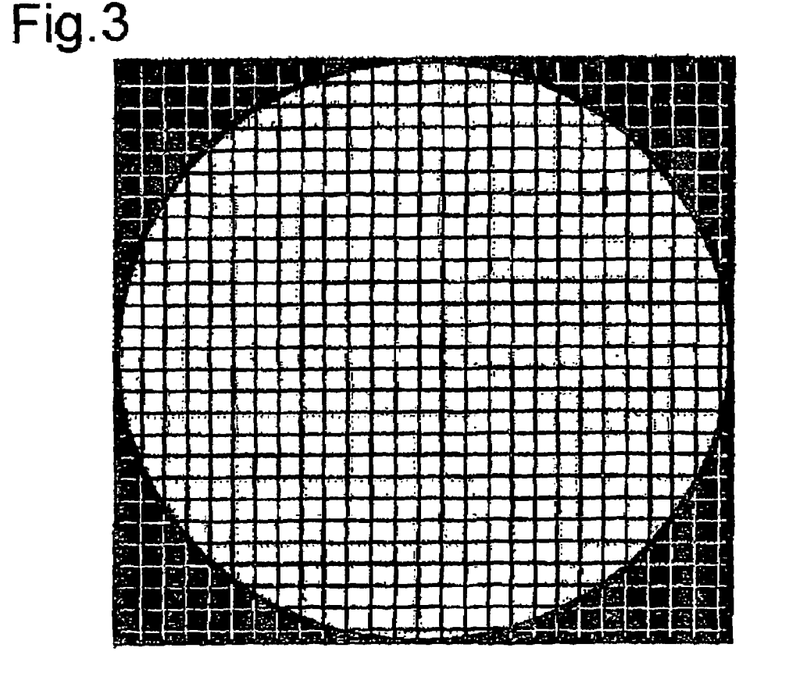
FIG. 3 is a view showing a field of measurement of wavefront aberration data.

Subsequently, the wavefront data measured in the state of not setting the calcium fluoride single crystal are subtracted from the wavefront data measured in the state of setting the calcium fluoride single crystal 44 which is the sample. In this way, a measurement error attributable to a wavefront aberration caused by a surface shape of the calcium fluoride single crystal 44 is removed. At the same time, an error caused by a wavefront aberration attributable to the interferometer itself is also removed. Accordingly, it is possible to measure only two-dimensional distribution of a transmitted wavefront aberration attributable to the refractive index inhomogeneity inside the calcium fluoride single crystal 44. The wavefront aberration data are acquired as a two-dimensional array of regions partitioned into a mesh shape as shown in FIG. 3.

Next, the two-dimensional distribution data of the wavefront aberration obtained by the above-described measurement are subjected to two-dimensional discrete Fourier transform to obtain a two-dimensional power spectrum of fluctuation of the transmission wavefront. The two-dimensional discrete Fourier transform is executed in accordance with a FFT (fast Fourier transform) algorithm. However, when the measurement of the wavefront aberration is executed on a circular region (a white region in FIG. 3), it is appropriate perform the following procedures. Specifically, the entire rectangular region having the circular region as an inscribed circle is set as a FFT target. Meanwhile, in terms of a portion where there are no wavefront aberration data, that is, the portion inside the rectangular region and outside the circular region (a black region in FIG. 3), the FFT is executed while the wavefront aberration is set to zero.

The two-dimensional power spectrum is obtained by the following formula.

[Formula 1]

Two-Dimensional Discrete Fourier Transform Formula $$F(fx_k, fy_l) = \sum_{px}^{N-1} \sum_{py}^{N-1} Z(px, py) \exp\left(\frac{-j2\pi pxk}{N}\right) \exp\left(\frac{-j2\pi pyl}{N}\right)$$

Z (px, py): wavefront aberration value at (px, py)

N: the number of pixels in x direction and y direction k: integer satisfying $0 \leq k \leq N$ l: integer satisfying $0 \leq l \leq N$

[Formula 2]

Formula for Calculating Two-Dimensional Power Spectrum $$p(fx_k, fy_l) = Re[F(fx_k, fy_l)]^2 + Im[F(fx_k, fy_l)]^2$$

Two-dimensional power spectral density (PSD) is calculated in accordance with the following formula by use of the two-dimensional power spectrum thus obtained.

[Formula 3]

Formula for Calculating Power Spectral Density $$PSD(fx_k, fy_l) = \frac{1}{N^2} P(fx_k, fy_l)$$

Next, an Average Radial PSD value of a component of a spatial frequency f is calculated by use of the above-described two-dimensional PSD data. In fact, the above-described two-dimensional PSD data take the form of discrete values, and a data interval $\Delta fx(=\Delta fy)$ on the frequency plane is equivalent to $(N \times h)^{-1}$ (mm$^{-1}$) when a pixel interval is defined as h (mm/pixel). Thus, the Average Radial PSD value is also obtained as a discrete value.

$$AverageRadialPSD(r \times \Delta f) = \frac{1}{n_r} \sum PSD(fx_k, fy_l) \quad \text{[Formula 4]}$$

$$\left(0 \leq r < \frac{N}{2} r : \text{integer}\right)$$

$\Sigma$: sum of (k, l) satisfying $(r \times \Delta f)^2 \leq fx_k^2 + fy_l^2 < \{(r+1) \times \Delta f\}^2$ $n_r$: sum of points satisfying the above condition According to the above-described procedures, Average Radial PSD (f) at the interval of $\Delta f = (N \times h)^{-1}$ (mm$^{-1}$) can be obtained.

The following formula is used for calculating an RMS value of a predetermined spatial frequency component ($f1 \leq f < f2$) by use of the above-mentioned Average Radial PSD value.

$$RMS^2 = \sum_{f=f_1}^{f_2} \{AverageRadialPSD(f) \cdot 2\pi f \cdot \Delta f\} \quad \text{[Formula 5]}$$

Note that, when the measurement region is not a rectangle, and when the FFT is executed by setting the portion without any wavefront aberration data being equal to zero, it is necessary to correct the RMS value, which is a calculation result, as follows.

$$RMS_{true} = \sqrt{\frac{N_{ALL}}{N_A}} RMS \quad \text{[Formula 6]}$$

$N_{ALL}$: the number of total data pieces ($=N^2$)

$N_A$: the number of measured data pieces

RMS: RMS value before correction $RMS_{true}$: RMS value after correction

Here, considering an actual projection optical system, a light beam with a predetermined numerical aperture emitted from one point on an object side, passes through each optical member at a different luminous flux diameter, that is, a partial diameter. Thus, an influence of the wavefront aberration to each optical member is not determined by the spatial frequency of the fluctuation of the wavefront itself, but by a relative ratio between the partial diameter and the spatial frequency. For this reason, in order to evaluate the influence of the refractive index homogeneity to the short-range flare, it is appropriate to apply a spatial frequency normalized by the partial diameter, that is, the number of periods in partial diameter.

Assuming that the partial diameter is PD (mm) and that the spatial frequency is f (mm$^{-1}$), the number of periods $f_{PD}$ in partial diameter is defined as $f_{PD} = PD \times f$. Thus, the RMS value of a frequency component where the number of periods in partial diameter is in a range from $f_{PD1}$ to $f_{PD2}$ may be calculated as $f_1 = f_{PD1}/PD$ and $f_2 = f_{PD2}/PD$ in the respective formulae described above.

According to researches conducted by the inventors of the present invention, it is known that the fluctuation of the wavefront equivalent to the number of periods in partial diameter in a range from at least 10 periods to 150 periods gives a large impact on the short-range flare. To reduce the short-range flare of the projection optical system, it is effective to reduce the fluctuation of the wavefront of the frequency component corresponding to the number of periods in partial diameter in the range from 10 periods to 150 periods particularly in the calcium fluoride single crystal among optical materials that constitute each optical member.

Figure 4:
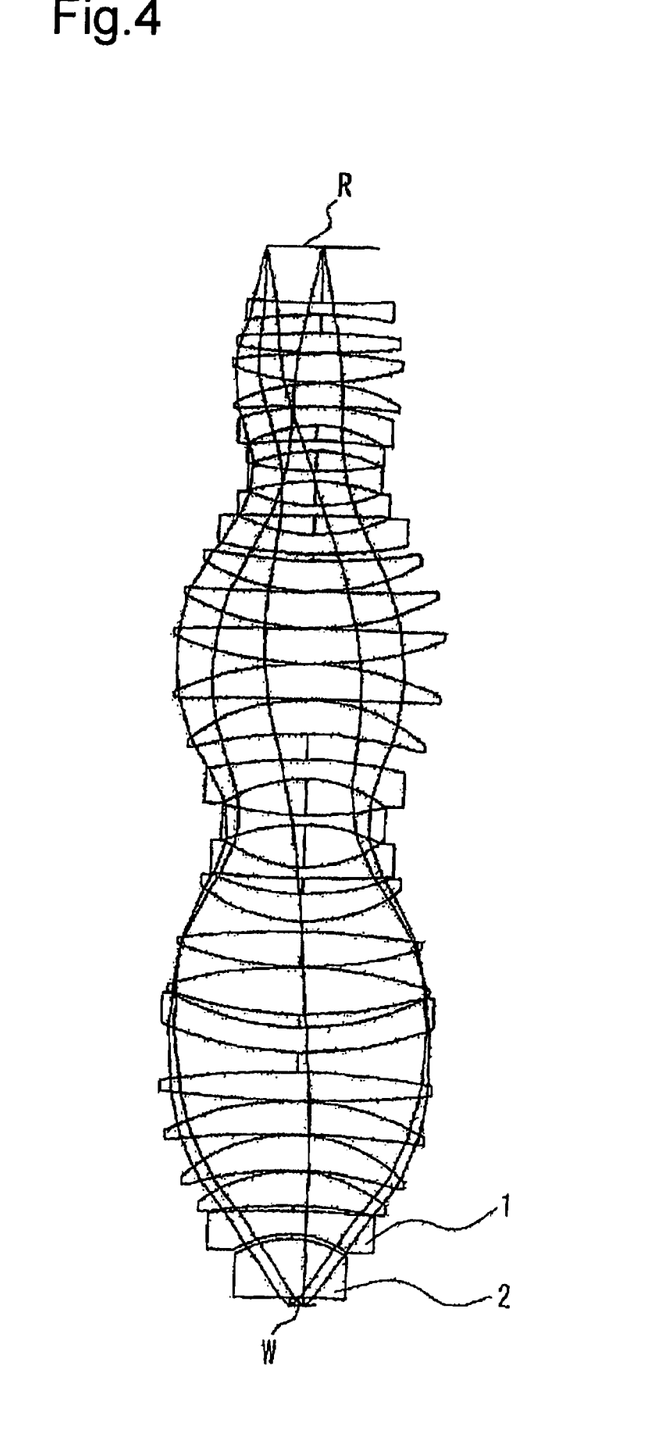
FIG. 4 is a view showing a preferred embodiment of a projection optical system of the present invention.

When evaluating the optical member based on the wavefront aberration data measured with the interferometer, a measurement upper limit of the spatial frequency component of the fluctuation of wavefront depends on spatial resolution of the interferometer. While the wavefront aberration is measured for each of element points partitioned into the mesh shape as shown in FIG. 4, the number of measured points per unit length determines an upper limit frequency of the two-dimensional power spectrum. Meanwhile, an influence to a final amount of flare when constructing the optical system by combining the optical members depends on a frequency component in partial diameter of the fluctuation of wavefront in each optical member. Thus, upon measurement of the wavefront aberration of each optical member, it is desirable to increase measured point density sufficiently in a region corresponding to the partial diameter. In the case of an optical member having a large partial diameter, it is possible to set low measured point density per unit area. However, in the case of an optical member having a small partial diameter, it is necessary to measure the wavefront aberration at high density.

The upper limit of measurement of the spatial frequency becomes low when the spatial resolution of the interferometer is low. It may be difficult to measure the spatial frequency component in a predetermined range, depending on the combination with the partial diameter. Accordingly, to realize a projection optical system that reduces the short-range flare, the inventors of the present invention decide to consider the upper limit of measurement of the spatial frequency when restricting an upper limit of the RMS value of the fluctuation of the transmission wavefront.

In the projection optical system provided with at least one of optical members made of the calcium fluoride single crystal considering the upper limit of measurement of the spatial frequency, each of the optical members satisfies at least any one of the following conditions of (i) to (iii):

(i) an RMS value of a spatial frequency component having a number of periods $f_{PD}$ in partial diameter in a range from 10 periods to 50 periods inclusive out of fluctuation of a transmission wavefront relative to light having a wavelength of 633 nm is equal to or below 0.35 nm/cm;

(ii) an RMS value of a spatial frequency component having a number of periods $f_{PD}$ in partial diameter in a range from 10 periods to 100 periods inclusive out of fluctuation of a transmission wavefront relative to light having a wavelength of 633 nm is equal to or below 0.45 nm/cm; and (iii) an RMS value of a spatial frequency component having a number of periods $f_{PD}$ in partial diameter in a range from 10 periods to 150 periods inclusive out of fluctuation of a transmission wavefront relative to light having a wavelength of 633 nm is equal to or below 0.50 nm/cm. According to the projection optical system described above, it is possible to realize the projection optical system which reduces the short-range flare.

Meanwhile, as for the projection optical system, it is preferable to have any of the projection optical system in which each of the optical members satisfies a condition that the RMS of the spatial frequency component having the number of periods in partial diameter in the range from 10 periods to 50 periods inclusive is equal to or below 0.35 nm/cm; the projection optical system in which each of the optical members satisfies a condition that the RMS of the spatial frequency component having the number of periods in partial diameter in the range from 10 periods to 100 periods inclusive is equal to or below 0.45 nm/cm; and the projection optical system in which each of the optical members satisfies a condition that the RMS of the spatial frequency component having the number of periods in partial diameter in the range from 10 periods to 150 periods inclusive is equal to or below 0.50 nm/cm.

Moreover, as for the projection optical system, from the viewpoint of achieving the projection optical system that further reduces the short-range flare, it is more preferable that each of the optical members satisfy a condition that the RMS of the spatial frequency component having the number of periods in partial diameter in the range from 10 periods to 100 periods inclusive is equal to or below 0.35 nm/cm. In addition, as for the projection optical system, it is more preferable that each of the optical members satisfy a condition that the RMS of the spatial frequency component having the number of periods in partial diameter in the range from 10 periods to 150 periods inclusive is equal to or below 0.45 nm/cm, or, in particular equal to or below 0.35 nm/cm.

Moreover, as for the projection optical system, it is more preferable that each of the optical members satisfy at least two conditions out of the above-described conditions of (i) to (iii), or all conditions of the above-described conditions (i) to (iii) in particular.

Moreover, as for the projection optical system, it is more preferable that the Average Radial PSD value be not exceeding 0.01 nm$^2$/period$^2$ in the above-mentioned range of the number of periods in partial diameter. This is because that the above-described RMS value means an average value in a predetermined frequency band, and even if the average value is equal to or below the upper limit, the influence to the short-range flare is not negligible in a case where a certain spatial frequency component in the band has an extremely large value.

FIG. 4 shows a schematic diagram of one embodiment of a lens configuration of a projection optical system which is suitable as the projection optical system of the present invention. In the projection optical system shown in FIG. 4, a lens 1 and a lens 2 are made of calcium fluoride single crystals, and the rest of lenses are made of synthetic silica glass. In FIG. 4, R denotes a mask and W denotes a wafer.

In the projection optical system shown in FIG. 4, the partial diameter of the lens 1 is designed to be 125 mm, while the partial diameter of the lens 2 is designed to be 50 mm. Moreover, lenses used as the lens 1 and the lens 2 are those satisfying conditions that RMS of the spatial frequency component having the number of periods in partial diameter in the range from 10 periods to 50 periods inclusive is equal to or below 0.35 nm/cm as well as that the Aberage Radial PSD value is equal to or below 0.01 nm$^2$/period$^2$, respectively. Note that, antireflective films are formed on respective surfaces of the lens 1 and the lens 2 in the projection optical system shown in FIG. 4. Such an antireflective film can be formed in accordance with a known vapor deposition method or sputtering method.

Moreover, the lens 1 and the lens 2 are obtained by selecting a calcium fluoride single crystal satisfying the RMS value equal to or below 0.35 nm/cm and the Aberage Radial PSD value equal to or below 0.01 nm$^2$/period$^2$ in the above-mentioned spatial frequency band among calcium fluoride single crystals manufactured by adopting a known method (such as the Bridgman method), and thereafter by processing this crystal.

In this way, in the projection optical system shown in FIG. 4, each of the optical members made of the calcium fluoride single crystal is configured to have the specific spatial frequency component affecting the short-range flare of the fluctuation of the transmission wavefront, which is equal to or below the predetermined value. Accordingly, it is possible to reduce the short-range flare on an exposure surface and thereby to obtain high resolution. Note that the synthetic silica glass other than the lens 1 and the lens 2 in the projection optical system shown in FIG. 4 is not particularly limited, and silica glass obtained by use of an appropriate known method is used thereto.

Note that, as described previously, in the projection optical system of the present invention, each of the optical members made of the calcium fluoride single crystal arranged in the projection optical system only needs to satisfy at least any one of the following conditions of (i) to (iii):

(i) an RMS value of the spatial frequency component having a number of periods $f_{PD}$ in partial diameter in the range from 10 periods to 50 periods inclusive out of fluctuation of a transmission wavefront relative to light having a wavelength of 633 nm is equal to or below 0.35 nm/cm;

(ii) an RMS value of the spatial frequency component having a number of periods $f_{PD}$ in partial diameter in the range from 10 periods to 100 periods inclusive out of fluctuation of a transmission wavefront relative to light having a wavelength of 633 nm is equal to or below 0.45 nm/cm; and (iii) an RMS value of the spatial frequency component having a number of periods $f_{PD}$ in partial diameter in the range from 10 periods to 150 periods inclusive out of fluctuation of a transmission wavefront relative to light having a wavelength of 633 nm is equal to or below 0.50 nm/cm. The configurations of the rest of the optical members are not particularly limited.

For example, the lens 1 and the lens 2 in this embodiment use the lenses satisfying the conditions that the RMS of the spatial frequency component having the number of periods in partial diameter in the range from 10 periods to 50 periods inclusive is equal to or below 0.35 nm/cm as well as the Aberage Radial PSD value is equal to or below 0.01 nm$^2$/period$^2$ in the above-mentioned spatial frequency band, respectively. Alternatively, it is also possible to use lenses satisfying the RMS of the spatial frequency component having the number of periods in partial diameter in the range from 10 periods to 100 periods inclusive being equal to or below 0.45 nm/cm, or lenses satisfying the RMS of the spatial frequency component having the number of periods in partial diameter in the range from 10 periods to 150 periods inclusive being equal to or below 0.50 nm/cm, as the lens 1 and the lens 2.

Meanwhile, two pieces of the optical members made of the calcium fluoride single crystal are used in this embodiment. However, the number of the optical members made of the calcium fluoride single crystal for use in the projection optical system of the present invention is not particularly limited as long as the optical members are made of the calcium fluoride single crystal that satisfies at least any one of the conditions of (i) to (iii).

Moreover, although the lens is constructed as shown in FIG. 4 in this embodiment, the lens configuration in the projection optical system of the present invention is not particularly limited. It is also possible to modify and use the lens configuration appropriately to meet the objective.

Next, a method of manufacturing a projection optical system of the present invention will be described. The method of manufacturing a projection optical system of the present invention is a method including a step (A) of measuring transmission wavefronts of calcium fluoride single crystals and finding two-dimensional distribution of wavefront aberrations, a step (B) of Fourier transforming the two-dimensional distribution and calculating two-dimensional power spectra of fluctuations of the transmission wavefronts, a step (C) of calculating Average Radial PSD value for each spatial frequency in the two-dimensional power spectra, a step (D) of calculating an RMS value by integrating the Average Radial PSD values in a predetermined spatial frequency range, a step (E) of selecting the calcium fluoride single crystal having the RMS value equal to or below a predetermined upper limit, a step (F) of manufacturing an optical member by processing the selected calcium fluoride single crystal, and a step (G) of manufacturing a projection optical system including at least one of the optical members made of the calcium fluoride single crystal.

The calcium fluoride single crystal used in the method of manufacturing a projection optical system of the present invention is not particularly limited. It is also possible to use a calcium fluoride single crystal manufactured by adopting a known method (such as the Bridgman method) as appropriate.

As for the steps (A) to (D), it is possible to adopt a method of evaluating the transmission wavefront fluctuation of the calcium fluoride single crystal favorably. Moreover, the calcium fluoride single crystal is selected in the step (E), which has the RMS value thus evaluated being equal to or below the predetermined upper limit.

As for the condition of the RMS value, it is preferable that the RMS of the spatial frequency component having the number of periods in partial diameter in the range from 10 periods to 50 periods inclusive be equal to or below 0.35 nm/cm, or that the RMS of the spatial frequency component having the number of periods in partial diameter in the range from 10 periods to 100 periods inclusive be equal to or below 0.45 nm/cm, or that the RMS of the spatial frequency component having the number of periods in partial diameter in the range from 10 periods to 150 periods inclusive be equal to or below 0.50 nm/cm. By satisfying any of the above-mentioned conditions, there is a tendency that it is possible to manufacture a projection optical system which further reduces the short-range flare.

Next, in the step (F), the optical member (such as a lens) is manufactured by processing the calcium fluoride single crystal selected as described above. The processing method of the calcium fluoride therein is not particularly limited, so it is possible to apply a known method as appropriate. Moreover, by processing the optical member in this way, it is possible to manufacture the optical member in a shape (such as a concave lens or a convex lens) corresponding to a layout position or other factors in the projection optical system.

Moreover, in the step (G), the projection optical system is manufactured by use of the optical member thus produced. Although a method of obtaining the projection optical system is not particularly limited, it is possible to cite a method of obtaining a projection optical system by using assembly equipment, setting one or multiple lenses into each split lens barrel according to a design, and assembling multiple split lens barrels each housing one or multiple lenses, for example. Note that it is possible to refer to Japanese Unexamined Patent Application Publication No. 2001-258131 (JP 2001-258131 A) and the like about details concerning the assembly equipment used for setting the lenses into the respective split lens barrels and assembling the multiple split lens barrels, for example.

Exposure Apparatus

Second Embodiment

Next, an exposure apparatus including the projection optical system of the present invention configured to reduce the short-range flare will be described.

Figure 5:
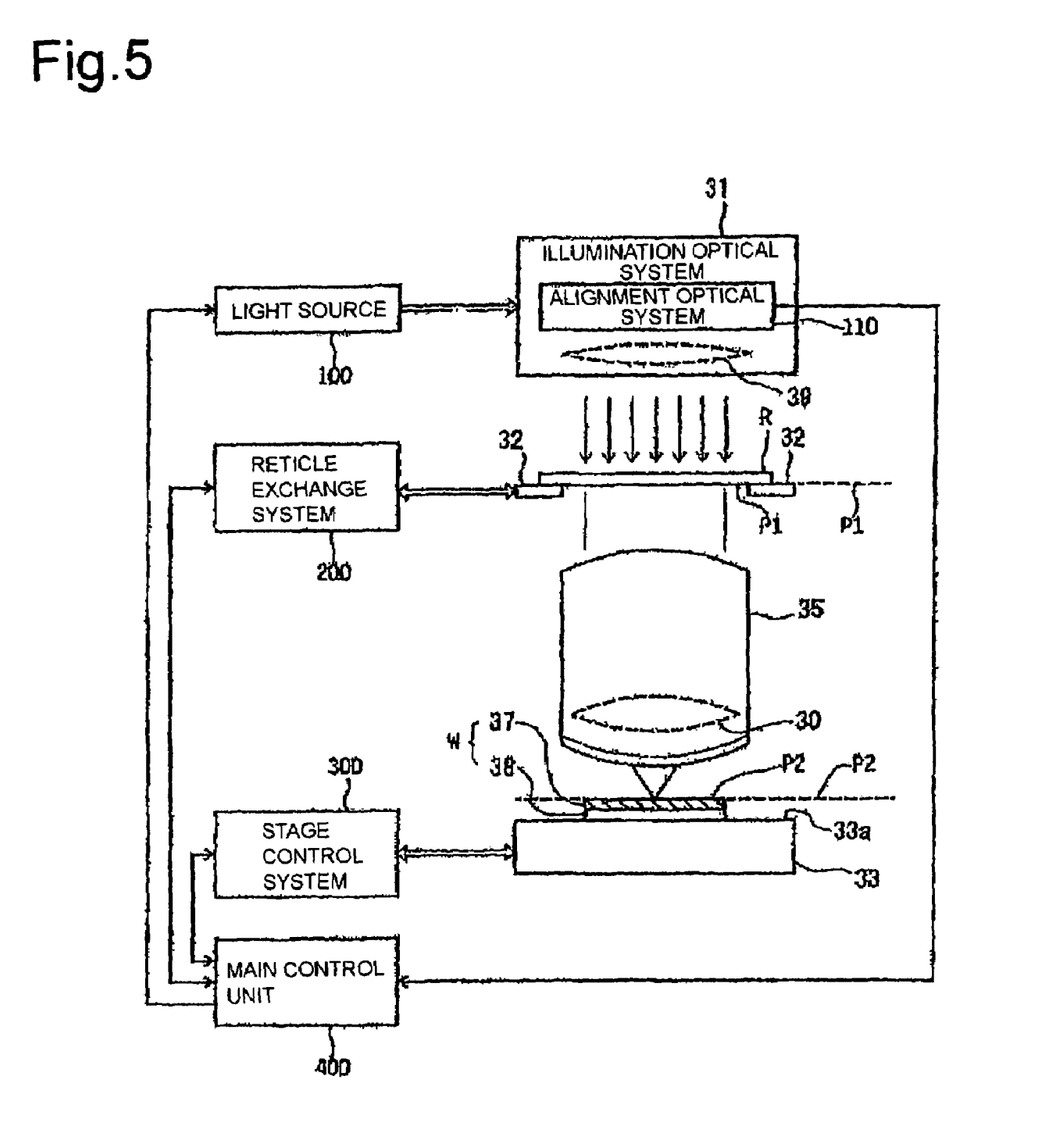
FIG. 5 is a view showing a preferred embodiment of an exposure apparatus of the present invention.

FIG. 5 is a schematic drawing showing an embodiment of an exposure apparatus suitable for an exposure apparatus of the present invention. The exposure apparatus shown in FIG. 5 includes: a wafer stage 33, which is capable of placing a substrate 38 coated with a photosensitizing agent 37 and placed on a surface 33a (all of these constituents will be simply referred to as a "substrate W"); an illumination optical system 31 for irradiating vacuum ultraviolet rays having a wavelength prepared as exposure light and transferring a pattern (a reticle R) of a mask prepared on the substrate W; a vacuum ultraviolet light source 100 for supplying the exposure light to the illumination optical system 31; and a projection optical system 35 which is disposed between a primary surface P1 (an object surface) where a mask R for projecting an image pattern of the mask R onto the substrate W is placed and a secondary surface (an imaging surface) aligned with a surface of the substrate W.

The illumination optical system 31 includes an alignment optical system 110 for adjusting a relative position between the mask R and a wafer W. The mask R is disposed on a reticle stage 32 which is movable in parallel to the surface of a wafer stage 33. A reticle exchange system 200 exchanges and conveys the reticle (the mask R) set on the reticle stage 32. The reticle exchange system 200 includes a stage driver for moving the reticle stage 32 in parallel to the surface 33a of the wafer stage 33. The projection optical system 35 includes an alignment optical system which can be utilized to a scan-type exposure apparatus.

Moreover, the exposure apparatus shown in FIG. 5 includes the projection optical system according to any of <1> to <5> described above. To be more precise, the exposure apparatus shown in FIG. 5 is the exposure apparatus in which the optical member made of the calcium fluoride single crystal among the optical members 30 included in the projection optical system 35 has the RMS value of the predetermined spatial frequency component derived from the partial diameter out of the fluctuation of the transmission wavefront being equal to or below the predetermined upper limit, and has the Average Radial PSD value being equal to or below the predetermined upper limit.

Here, in FIG. 5, reference numeral 300 denotes a stage control system for controlling the wafer stage 3 while reference numeral 400 denotes a main control unit for controlling the entire apparatus. Since this exposure apparatus includes the projection optical system according to the present invention, the short-range flare on the surface of the wafer is reduced, and high resolution can be achieved.

Note that the present invention is applicable not only to a scanning projection exposure apparatus of a step-and-scan type (U.S. Pat. No. 5,473,410) for exposing a reticle pattern while synchronously moving a reticle and a wafer, or namely a scanning stepper, but also to an exposure apparatus (a stepper) of a step-and-repeat type for exposing a reticle pattern while bringing a reticle and a wafer into a stationary condition and then sequentially moving the wafer stepwise.

Moreover, the present invention is also applicable to an exposure apparatus of a twin-stage type. Structures and exposure operations of twin-stage type exposure apparatuses are disclosed in Japanese Unexamined Patent Application Publication No. Hei 10-163099 (JP 10-163099 A) and Japanese Unexamined Patent Application Publication No. Hei 10-214783 (JP 10-214783 A) (corresponding to U.S. Pat. No. 6,341,007, No. 6,400,441, No. 6,549,269, and No. 6,590, 634), International Application Japanese-Phase Publication No. 2000-505958 (JP 2000-505958 A) (corresponding to U.S. Pat. No. 5,969,441), and U.S. Pat. No. 6,208,407, for example.

Furthermore, the present invention is also applicable to a liquid immersion exposure apparatus configured to fill a liquid locally between a projection optical system and an exposure object, a liquid immersion exposure apparatus configured to move a stage holding an exposure targeted substrate into a liquid tank, and a liquid immersion exposure apparatus configured to form a liquid tank having a predetermined depth on a stage and to hold a substrate therein. A structure and exposure operations of the liquid immersion exposure apparatus configured to move the stage holding the exposure targeted substrate into the liquid tank are disclosed, for example, in Japanese Unexamined Patent Application Publication No. Hei 6-124873 (JP 6-124873 A). The liquid immersion exposure apparatus configured to form the liquid tank having the predetermined depth on the stage and to hold the substrate therein are disclosed, for example, in Japanese Unexamined Patent Application Publication No. Hei 10-303114 (JP10-303114A) and U.S. Pat. No. 5,825,043.

As described above, the exposure apparatus of the present invention only needs to include the projection optical system according to any one of the aforementioned <1> to <5>, and other configurations thereof are not particularly limited. The above-mentioned U.S. Pat. Nos. 5,473,410, 6,341,007, 6,400, 441, 6,549,269, 6,590,634, 5,969,441, 6,208,407 and 5,825, 043, JP 10-163099 A, JP 10-214783 A, JP 6-124873 A and JP 10-303114 A, and JP 2000-505958 A are incorporated herein by reference.

Exposure Method

Third Embodiment

Next, an exposure method using the exposure apparatus of the present invention will be described.

Figure 6:
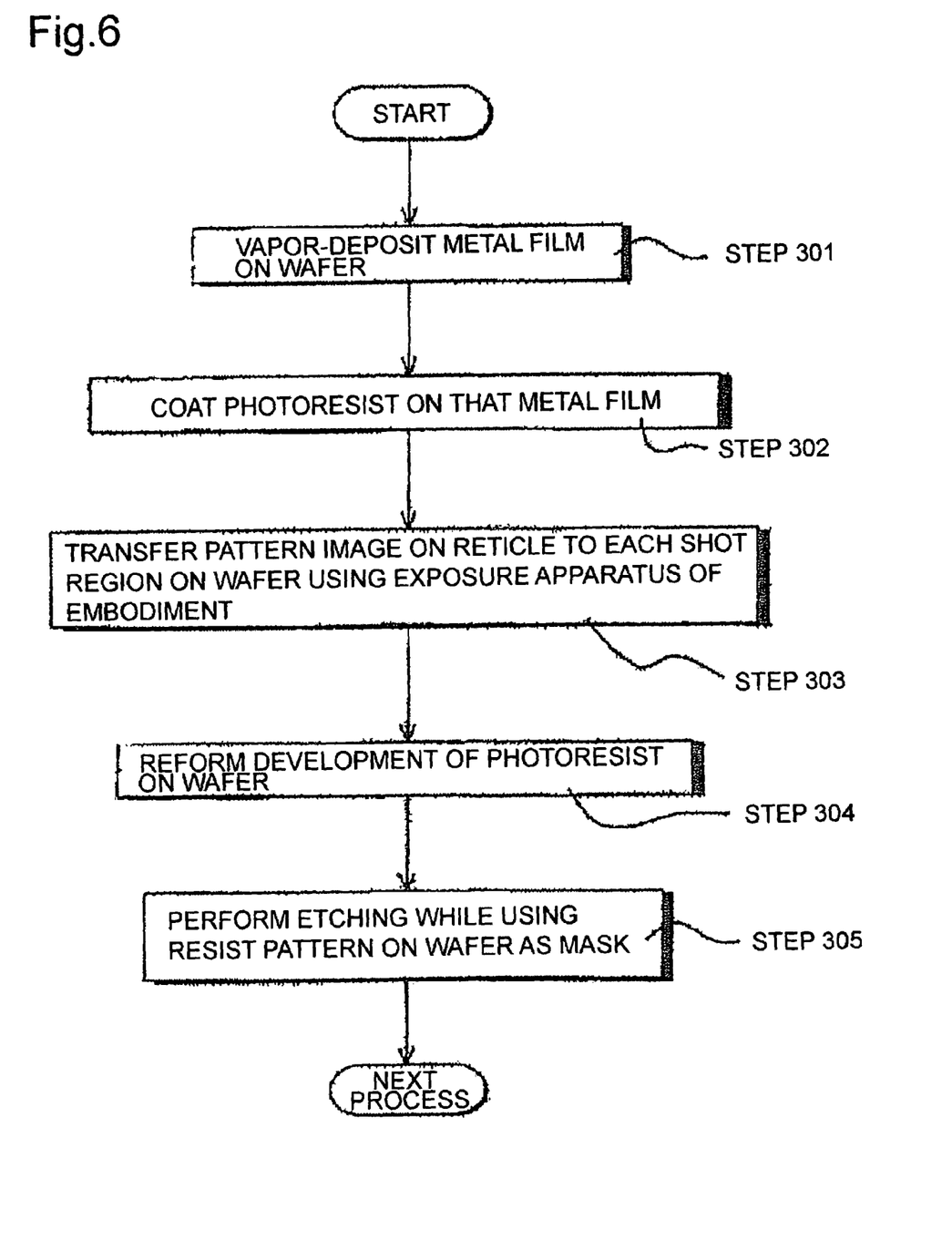
FIG. 6 is a flowchart showing a preferred example of an exposure method of the present invention.

Now, description will be made with reference to a flowchart of FIG. 6. First, in Step 301 of FIG. 6, a metal film is vapor-deposited on one lot of wafers. In the next Step 302, photoresist is coated on the metal film on the one lot of wafers. Thereafter, in Step 303, a pattern image on a mask is sequentially exposed on and transferred to each of shot regions on the one lot of wafers by use of the exposure apparatus shown in FIG. 5 through the projection optical system thereof. Thereafter, in Step 304, the photoresist on the one lot of wafers is developed. Then, in Step 305, a circuit pattern corresponding to the pattern on the mask are formed on each of the shot regions on each of the wafers by performing etching on the one lot of wafers while using the resist pattern as a mask. Thereafter, devices such as semiconductor elements are manufactured by performing formation of upper layer circuit patterns and the like. According to the above-described method of manufacturing a semiconductor device, it is possible to obtain semiconductor devices having superfine circuit patterns at high throughput.

Figure 7:
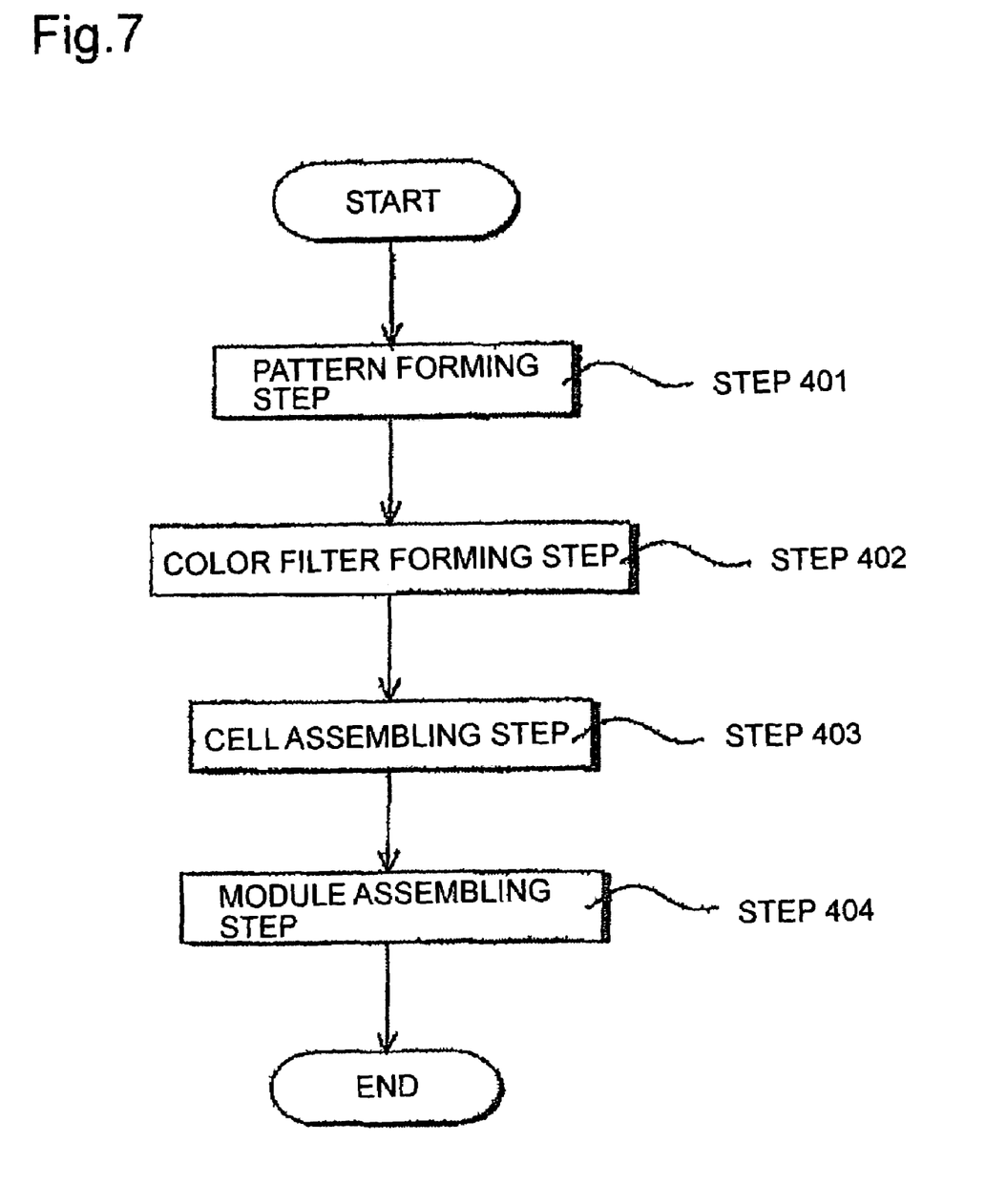
FIG. 7 is another flowchart showing the preferred example of the exposure method of the present invention.

Meanwhile, with the exposure apparatus shown in FIG. 5, it is also possible to obtain a liquid crystal display element as a microdevice by forming a given pattern (such as a circuit pattern or an electrode pattern) on a plate (a glass substrate). Now, an example of a method in this case will be described with reference to a flowchart of FIG. 7. In FIG. 7, a so-called photolithography process for transferring and exposing a mask pattern onto a photosensitive substrate (such as a glass substrate coated with resist) by use of the exposure apparatus of the above-described embodiment is executed in a pattern forming step 401. A given pattern including numerous electrodes and the like are formed on the photosensitive substrate by this photolithography process. Thereafter, the exposed substrate is subjected to respective processes including a development process, an etching process, and a resist removing process. Accordingly, the given pattern is formed on the substrate, and the process goes to a subsequent color filter forming step 402.

Next, in the color filter forming step 402, a color filter is formed, in which numerous sets of three dots corresponding to R (red), G (green), and B (blue) are arranged in a matrix or in which multiple sets of three-striped filters (R, G, and B) are arranged along a direction of horizontal scan lines. Then, a cell assembling step 403 is executed after the color filter forming step 402. In the cell assembling step 403, a liquid crystal panel (a liquid crystal cell) is assembled by use of the substrate including the given pattern obtained in the pattern forming step 401, the color filter obtained in the color filter forming step 402, and others.

In the cell assembling step 403, the liquid crystal panel (the liquid crystal cell) is manufactured by infusing liquid crystal between the substrate having the given pattern obtained in the pattern forming step 401 and the color filter obtained in the color filter forming step 402, for example. Thereafter, in a module assembling step 404, the liquid crystal display element is completed by fitting various components including an electric circuit for causing the assembled liquid crystal panel (the liquid crystal cell) to execute display operations, a backlight, and the like. According to the above-described method of manufacturing a liquid crystal display element, it is possible to obtain a liquid crystal display element having superfine circuit patterns at high throughput.

According to the exposure method of the embodiment described above, it is possible to form fine circuit patterns at high resolution by using the exposure apparatus of the present invention configured to reduce the short-range flare.

EXAMPLES

Now, the present invention will be described more in detail based on examples and a comparative example. It is to be noted, however, that the present invention will not be limited only to the following examples.

Example 1

The projection optical system having the above-described configuration shown in FIG. 4, which included the two optical members (the lenses) made of the calcium fluoride single crystal, was manufactured in Example 1. Now, the method of manufacturing the projection optical system will be described below.

The calcium fluoride single crystal was manufactured in accordance with the Bridgman method to begin with. The manufacturing process is as follows. High-purity calcium fluoride powder having particle sizes in a range from 0.1 μm to 5 mm was used as a raw material, and was subjected to heat fusion in a heating furnace after being added lead fluoride ($PbF_2$) as a fluorinating agent. Hence a pretreated product was manufactured, whose oxygen impurity was removed, and whose bulk density was improved.

This pretreated product was filled in a crucible of a single crystal manufacturing apparatus applying the Bridgman method, and the inside of the manufacturing apparatus was evacuated to a range from $10^{-2}$ Pa to $10^{-4}$ Pa. When the inside of the manufacturing apparatus reached the above-mentioned degree of vacuum, the crucible was heated with a heater at the upper side of the manufacturing apparatus. The pretreated product in the crucible was fused by raising a temperature equal to or above the melting point of calcium fluoride (1370° C. to 1450° C.). Next, the crucible was pulled down at a speed of about 0.1 mm/hour to 5 mm/hour toward a zone of a lower heater preset to be a lower temperature than that of the upper heater. Accordingly, a crystal was grown gradually from the bottom of the crucible, and the single crystal (an ingot) was manufactured by the crystallization to the uppermost top of the fused fluid.

The manufactured single crystal (the ingot) was slowly cooled down close to room temperature so as to avoid cracks. Then, the inside of the manufacturing apparatus was opened to the atmosphere, and the ingot was taken out. The ingot taken out of the crucible possessed large residual stress. Accordingly, a heat treatment was conducted while retaining the ingot shape, and the residual stress was thereby reduced. Multiple ingots were manufactured in accordance with the above-described process.

Next, a cylindrical calcium fluoride single crystal was cut out of each ingot thus obtained, and upper and lower surfaces thereof were subjected to mirror polishing in parallel to each other, thereby forming a sample. Then, a wavefront aberration was measured in accordance with the following method.

A Fizeau interferometer was used for measurement of the wavefront aberration. The structure of the interferometer used for measurement is as shown in FIG. 2A and FIG. 2B. First, the transparent oil 46 having the same refractive index as that of the calcium fluoride single crystal was filled in the gap between the two parallel flat plate members 43. Then a reference wave from a He—Ne laser beam was irradiated in this state, and wavefront data of the transmitted light was obtained by use of a CCD camera. Next, the sample 44 was set on, and the oil 46 was filled similarly. Then wavefront data were obtained by imaging the transmitted light. The two-dimensional distribution of the wavefront aberrations of the sample 44 was obtained by division of these wavefront data.

Using the two-dimensional distribution data of the wavefront aberrations obtained as described above, the two-dimensional PSD and the Aberage Radial PSD value were calculated in accordance with the aforementioned calculating methods. In the projection optical system having the configuration shown in FIG. 4, the partial diameter of the lens 1 is designed to be 125 mm. Thus, the spatial frequency corresponding to 10 periods of the number of periods in partial diameter becomes equal to 0.08 $mm^{-1}$. Similarly, the spatial frequency corresponding to 50 periods of the number of periods in partial diameter becomes equal to 0.40 $mm^{-1}$. Accordingly, in terms of each of the samples, the RMS value was calculated by integrating the Average Radial PSD values of components in an interval of the spatial frequencies from 0.08 $mm^{-1}$ to 0.40 $mm^{-1}$ based on the two-dimensional PSD data, and then the above-described correction was carried out in response to the shape of the measured region. Hence the RMS value of fluctuation of the transmission wavefront having the above-described spatial frequency components was calculated.

The sample satisfying this RMS value equal to or below 0.35 nm/cm and the Aberage Radial PSD value equal to or below 0.01 $nm^2/period^2$ within the above-mentioned spatial frequency band was selected. Then it was cut out and polished into a predetermined shape while defining the direction used for measurement of the wavefront aberration of the sample as a direction of an optical axis. Thereafter, a lens 1(a) was manufactured by forming an antireflective film on a surface thereof.

Meanwhile, in the projection optical system having the configuration shown in FIG. 4, the partial diameter of the lens 2 is designed to be 50 mm. Thus, the spatial frequency corresponding to 10 periods of the number of periods in partial diameter becomes equal to 0.20 $mm^{-1}$. Similarly, the spatial frequency corresponding to 50 periods of the number of periods in partial diameter becomes equal to 1.00 $mm^{-1}$. Accordingly, in terms of each of the samples, the RMS value was calculated by integrating the Average Radial PSD values of components in an interval of the spatial frequencies from 0.20 $mm^{-1}$ to 1.00 $mm^{-1}$ based on the two-dimensional PSD data, and then the above-described correction was carried out in response to the shape of the measured region. Hence the RMS value of fluctuation of the transmission wavefront having the above-described spatial frequency components was calculated for each sample.

The sample satisfying this RMS value equal to or below 0.35 nm/cm and the Aberage Radial PSD value equal to or below 0.01 $nm^2/period^2$ within the above-mentioned spatial frequency band was selected. Then it was cut out and polished into a predetermined shape while defining the direction used for measurement of the wavefront aberration of the sample as a direction of an optical axis. Thereafter, a lens 2(a) was manufactured by forming an antireflective film on a surface thereof.

The lens 1(a) and the lens 2(a) manufactured in accordance with the above-described method were combined with synthetic silica glass lenses manufactured in accordance with a conventional method, thereby manufacturing the projection optical system shown in FIG. 4.

The projection optical system manufactured in this example had an amount of short-range flare approximately equal to 1%, and therefore was provided with a sufficient performance.

Example 2

The projection optical system having the configuration shown in FIG. 4 was manufactured as similar to Example 1, except that a lens 1(b) and a lens 2(b) manufactured as described below were used instead of the lens 1(a) and the lens 2(a) manufactured in Example 1.

First, multiple samples were manufactured from the cylindrical calcium fluoride single crystals obtained as similar to Example 1, and wavefront aberrations were measured. Then, the two-dimensional PSD and the Aberage Radial PSD value were calculated in accordance with the aforementioned calculating methods by use of the obtained two-dimensional distribution data of the wavefront aberrations. In the projection optical system having the configuration shown in FIG. 4, the partial diameter of the lens 1 is designed to be 125 mm. Thus, the spatial frequency corresponding to 10 periods of the number of periods in partial diameter becomes equal to 0.08 mm$^{-1}$. Similarly, the spatial frequency corresponding to 100 periods of the number of periods in partial diameter becomes equal to 0.80 mm$^{-1}$. Accordingly, in terms of each of the samples, the RMS value was calculated by integrating the Average Radial PSD values of components in an interval of the spatial frequencies from 0.08 mm$^{-1}$ to 0.80 mm$^{-1}$ based on the two-dimensional PSD data, and then the above-described correction was carried out in response to the shape of the measured region. Hence the RMS value of fluctuation of the transmission wavefront having the above-described spatial frequency components was calculated.

Next, the sample satisfying this RMS value equal to or below 0.45 nm/cm and the Aberage Radial PSD value equal to or below 0.01 nm$^2$/period$^2$ within the above-mentioned spatial frequency band was selected. Then it was cut out and polished into a predetermined shape while defining the direction used for measurement of the wavefront aberration of the sample as a direction of an optical axis. Thereafter, the lens 1(b) was manufactured by forming an antireflective film on a surface thereof.

Meanwhile, in the projection optical system having the configuration shown in FIG. 4, the partial diameter of the lens 2 is designed to be 50 mm. Thus, the spatial frequency corresponding to 10 periods of the number of periods in partial diameter becomes equal to 0.20 mm$^{-1}$. Similarly, the spatial frequency corresponding to 100 periods of the number of periods in partial diameter becomes equal to 2.00 mm$^{-1}$. Accordingly, in terms of each of the samples, the RMS value was calculated by integrating the Average Radial PSD values of components in an interval of the spatial frequencies from 0.20 mm$^{-1}$ to 2.00 mm$^{-1}$ based on the two-dimensional PSD data, and then the above-described correction was carried out in response to the shape of the measured region. Hence the RMS value of fluctuation of the transmission wavefront having the above-described spatial frequency components was calculated depending for each sample.

The sample satisfying this RMS value equal to or below 0.45 nm/cm and the Aberage Radial PSD value equal to or below 0.01 nm$^2$/period$^2$ within the above-mentioned spatial frequency band was selected. Then, it was cut out and polished into a predetermined shape while defining the direction used for measurement of the wavefront aberration of the sample as a direction of an optical axis. Thereafter, the lens 2(b) was manufactured by forming an antireflective film on a surface thereof.

The projection optical system manufactured in this example including the lens 1(b) and the lens 2(b) manufactured as described above had an amount of short-range flare approximately equal to 1%, and therefore was provided with a sufficient performance.

Example 3

The projection optical system having the configuration shown in FIG. 4 was manufactured as similar to Example 1, except that a lens 1(c) and a lens 2(c) manufactured as described below were used instead of the lens 1(a) and the lens 2(a) manufactured in Example 1.

First, multiple samples were manufactured from the cylindrical calcium fluoride single crystals obtained as similar to Example 1, and wavefront aberrations were measured. Then, the two-dimensional PSD and the Aberage Radial PSD value were calculated in accordance with the aforementioned calculating methods by use of the obtained two-dimensional distribution data of the wavefront aberrations. In the projection optical system having the configuration shown in FIG. 4, the partial diameter of the lens 1 is designed to be 125 mm. Thus, the spatial frequency corresponding to 10 periods of the number of periods in partial diameter becomes equal to 0.08 mm$^{-1}$. Similarly, the spatial frequency corresponding to 150 periods of the number of periods in partial diameter becomes equal to 1.20 mm$^{-1}$. Accordingly, in terms of each of the samples, the RMS value was calculated by integrating the Average Radial PSD values of components in an interval of the spatial frequencies from 0.08 mm$^{-1}$ to 1.20 mm$^{-1}$ based on the two-dimensional PSD data, and then the above-described correction was carried out in response to the shape of the measured region. Hence the RMS value of fluctuation of the transmission wavefront having the above-described spatial frequency components was calculated.

Next, the sample satisfying this RMS value equal to or below 0.50 nm/cm and the Aberage Radial PSD value equal to or below 0.01 nm$^2$/period$^2$ within the above-mentioned spatial frequency band was selected. Then, it was cut out and polished into a predetermined shape while defining the direction used for measurement of the wavefront aberration of the sample as a direction of an optical axis. Thereafter, the lens 1(c) was manufactured by forming an antireflective film on a surface thereof.

Meanwhile, in the projection optical system having the configuration shown in FIG. 4, the partial diameter of the lens 2 is designed to be 50 mm. Thus, the spatial frequency corresponding to 10 periods of the number of periods in partial diameter becomes equal to 0.20 mm$^{-1}$. Similarly, the spatial frequency corresponding to 150 periods of the number of periods in partial diameter becomes equal to 3.00 mm$^{-1}$. Accordingly, in terms of each of the samples, the RMS value was calculated by integrating the Average Radial PSD values of components in an interval of the spatial frequencies from 0.20 mm$^{-1}$ to 3.00 mm$^{-1}$ based on the two-dimensional PSD data, and then the above-described correction was carried out in response to the shape of the measured region. Hence the RMS value of fluctuation of the transmission wavefront having the above-described spatial frequency components was calculated for each sample.

The sample satisfying this RMS value equal to or below 0.50 nm/cm and the Aberage Radial PSD value equal to or below 0.01 nm$^2$/period$^2$ within the above-mentioned spatial frequency band was selected. Then it was cut out and polished into a predetermined shape while defining the direction used for measurement of the wavefront aberration of the sample as a direction of an optical axis. Thereafter, the lens 2(c) was manufactured by forming an antireflective film on a surface thereof.

The projection optical system manufactured in this example including the lens 1(c) and the lens 2(c) manufactured as described above had an amount of short-range flare approximately equal to 1%, and therefore was provided with a sufficient performance.

Comparative Example 1

The projection optical system having the same configuration as Example 1 was manufactured in Comparative Example 1. However, instead of selecting the calcium fluoride single crystal by measuring the wavefront aberrations, a lens 1(d) and a lens 2(d) having the same shapes as the lens 1(a) and the lens 2(a) manufactured in Example 1 were manufactured by use of a randomly selected single crystal. As a result of assembling the projection optical system shown in FIG. 4 by use of the lens 1(d) and the lens 2(d) thus manufactured, an amount of short-range flare of the entire projection optical system was approximately equal to 5%, which showed a larger amount of flare as compared to the projection lenses manufactured in Examples 1 to 3.

INDUSTRIAL APPLICABILITY

As described above, according to the present invention, it is possible to provide a projection optical system capable of reducing short-range flare on an exposure surface and thereby obtaining high resolution, a manufacturing method thereof, an exposure apparatus including the projection optical system, and an exposure method using the exposure apparatus.

Therefore, the projection optical system of the present invention is particularly useful as a projection optical system used for an exposure apparatus for manufacturing a semiconductor element such as an LSI, a liquid crystal display element, a thin film magnetic head or the like.

The invention claimed is:

1. A projection optical system provided with at least one of optical members made of a calcium fluoride single crystal,
wherein each of the optical members satisfies at least any one of the following conditions of (i) to (iii):
(i) an RMS value of a spatial frequency component having a number of periods $f_{PD}$ in partial diameter in a range from 10 periods to 50 periods inclusive, out of fluctuation of a transmission wavefront relative to light having a wavelength of 633 nm, is equal to or below 0.35 nm/cm;
(ii) an RMS value of a spatial frequency component having a number of periods $f_{PD}$ in partial diameter in a range from 10 periods to 100 periods inclusive, out of fluctuation of a transmission wavefront relative to light having a wavelength of 633 nm, is equal to or below 0.45 nm/cm; and
(iii) an RMS value of a spatial frequency component having a number of periods $f_{PD}$ in partial diameter in a range from 10 periods to 150 periods inclusive, out of fluctuation of a transmission wavefront relative to light having a wavelength of 633 nm, is equal to or below 0.50 nm/cm.

2. The projection optical system according to claim 1,
wherein each of the optical members satisfies a condition that the RMS value of the spatial frequency component having the number of periods $f_{PD}$ in partial diameter in the range from 10 periods to 50 periods inclusive, out of fluctuation of the transmission wavefront relative to the light having the wavelength of 633 nm, is equal to or below 0.35 nm/cm.

3. The projection optical system according to claim 1,
wherein each of the optical members satisfies a condition that the RMS value of the spatial frequency component having the number of periods $f_{PD}$ in partial diameter in the range from 10 periods to 100 periods inclusive, out of the fluctuation of the transmission wavefront relative to the light having the wavelength of 633 nm, is equal to or below 0.45 nm/cm.

4. The projection optical system according to claim 1,
wherein each of the optical members satisfies a condition that the RMS value of the spatial frequency component having the number of periods $f_{PD}$ in partial diameter in the range from 10 periods to 150 periods inclusive, out of the fluctuation of the transmission wavefront relative to the light having the wavelength of 633 nm, is equal to or below 0.50 nm/cm.

5. The projection optical system according to claim 1,
wherein each of the optical members satisfies a condition that an Average Radial PSD value of the spatial frequency component having the number of periods $f_{PD}$ in partial diameter in the ranges, out of the fluctuation of the transmission wavefront relative to the light having the wavelength of 633 nm, is equal to or below 0.01 nm$^2$/period$^2$.

6. An exposure apparatus comprising:
the projection optical system according to claim 1.

7. An exposure method using the exposure apparatus according to claim 6.

8. A method of manufacturing a projection optical system comprising the steps of:
measuring transmission wavefronts of calcium fluoride single crystals and finding two-dimensional distribution of wavefront aberrations;
Fourier transforming the two-dimensional distribution and calculating two-dimensional power spectra of fluctuations of the transmission wavefronts;
calculating an Average Radial PSD value for each spatial frequency in the two-dimensional power spectra;
calculating an RMS value by integrating the Average Radial PSD values in a predetermined spatial frequency range;
selecting the calcium fluoride single crystal having the RMS value equal to or below a predetermined upper limit;
manufacturing an optical member by processing the selected calcium fluoride single crystal; and
manufacturing a projection optical system including at least one of the optical member made of the calcium fluoride single crystal.

9. The method of manufacturing a projection optical system according to claim 8,
wherein the spatial frequency range satisfies the number of periods $f_{PD}$ in partial diameter in a range from 10 periods to 50 periods inclusive, and the upper limit of the RMS value is equal to 0.35 nm/cm.

10. The method of manufacturing a projection optical system according to claim 8, wherein the spatial frequency range satisfies the number of periods $f_{PD}$ in partial diameter in a range from 10 periods to 100 periods inclusive, and the upper limit of the RMS value is equal to 0.45 nm/cm.

11. The method of manufacturing a projection optical system according to claim 8,
wherein the spatial frequency range satisfies the number of periods $f_{PD}$ in partial diameter in a range from 10 periods to 150 periods inclusive, and the upper limit of the RMS value is equal to 0.50 nm/cm.

12. The method of manufacturing a projection optical system according to claim 8, further comprising the step of:
selecting the calcium fluoride single crystal satisfying the Average Radial PSD value equal to or below a predetermined upper limit in the predetermined spatial frequency range.

13. The method of manufacturing a projection optical system according to claim 12,
wherein the upper limit of the Average Radial PSD value is equal to 0.01 $nm^2/period^2$.

* * * * *